(12) United States Patent
Chen et al.

(10) Patent No.: US 7,026,376 B2
(45) Date of Patent: Apr. 11, 2006

(54) FLUXING AGENT FOR UNDERFILL MATERIALS

(75) Inventors: Tian-An Chen, Phoenix, AZ (US); Daoqiang Lu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 272 days.

(21) Appl. No.: 10/610,577

(22) Filed: Jun. 30, 2003

(65) Prior Publication Data

US 2004/0261904 A1    Dec. 30, 2004

(51) Int. Cl.
    *C08L 93/04*     (2006.01)
    *C09D 193/04*     (2006.01)
    *B23K 35/363*     (2006.01)

(52) U.S. Cl. .............. 523/176; 523/455; 148/25; 257/778; 427/96.2; 427/96.6; 106/218; 106/241

(58) Field of Classification Search ............... 106/218, 106/241; 148/25; 257/778; 427/96.2, 96.6; 523/176, 455; 524/270
See application file for complete search history.

(56) References Cited

U.S. PATENT DOCUMENTS

| | | | |
|---|---|---|---|
| 4,619,715 A | 10/1986 | Hwang | |
| 4,643,848 A | 2/1987 | Thomas et al. | |
| 4,851,153 A | 7/1989 | Kono et al. | |
| 5,021,269 A | 6/1991 | Kono et al. | |
| 5,059,272 A | 10/1991 | Kono et al. | |
| 5,504,129 A | 4/1996 | Dandreaux et al. | |
| 5,985,043 A | 11/1999 | Zhou et al. | |
| 5,985,456 A | 11/1999 | Zhou et al. | |
| 6,017,634 A | 1/2000 | Capote et al. | |
| 6,057,381 A | 5/2000 | Ma et al. | |
| 6,063,828 A | 5/2000 | Ma et al. | |
| 6,121,689 A | 9/2000 | Capote et al. | |
| 6,132,646 A | 10/2000 | Zhou et al. | |
| 6,165,309 A | 12/2000 | Burnell et al. | |
| 6,180,187 B1 | 1/2001 | Ma et al. | |
| 6,180,696 B1 | 1/2001 | Wong et al. | |
| 6,218,449 B1 | 4/2001 | Planche et al. | |
| 6,238,948 B1 | 5/2001 | Ramalingam | |
| 6,249,034 B1 | 6/2001 | Li | |
| 6,297,560 B1 | 10/2001 | Capote et al. | |
| 6,331,446 B1 | 12/2001 | Cook et al. | |
| 6,350,840 B1 | 2/2002 | Schultz et al. | |
| 6,350,841 B1 | 2/2002 | Schultz et al. | |
| 6,365,973 B1 | 4/2002 | Koning | |
| 6,458,472 B1 * | 10/2002 | Konarski et al. | ........... 428/620 |
| 6,518,677 B1 | 2/2003 | Capote et al. | |
| 6,528,345 B1 | 3/2003 | Cook et al. | |
| 6,583,263 B1 | 6/2003 | Gaudl | |
| 2003/0162911 A1 * | 8/2003 | Xiao et al. | ................ 525/533 |

* cited by examiner

*Primary Examiner*—David Brunsman
(74) *Attorney, Agent, or Firm*—Blakely, Sokoloff, Taylor & Zafman LLP

(57) ABSTRACT

An underfill material, such as a no flow underfill material, containing an anhydride adduct of a rosin compound is disclosed. In one aspect, the anhydride adduct of a rosin compound contains an organic rosin acid moiety and a substitute moiety for a hydroxyl group of a carboxylic acid attached at an acyl group of the organic rosin acid moiety. In another aspect, the anhydride adduct of the rosin compound contains a plurality of linked organic rosin acid moieties. Methods of using the underfill materials and packages formed by curing the underfill materials are also disclosed.

13 Claims, 6 Drawing Sheets

FLUXING AGENT FOR UNDERFILL MATERIALS

BACKGROUND

1. Field

An embodiment of the invention relates to a fluxing agent for an underfill material.

2. Background Information

No flow underfill materials for microelectronic packages often contain fluxing agents to help remove metal oxides from solder bumps during solder reflow. Commonly employed fluxing agents include low molecular weight carboxylic acids and anhydrides. A potential problem with employing such low molecular weight agents is that voids may form due to vaporization of the fluxing agents during the elevated temperatures used during reflow or underfill material curing. The voids may concentrate thermomechanical stresses, trap undesired moisture, or otherwise reduce the effectiveness of the underfill material and degrade device reliability. Another potential problem, when employing carboxylic acids, is premature reaction with the underfill material, which may potentially lead to increased viscosity, poor solder joint formation, and reduce production yields.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

Figure 1:
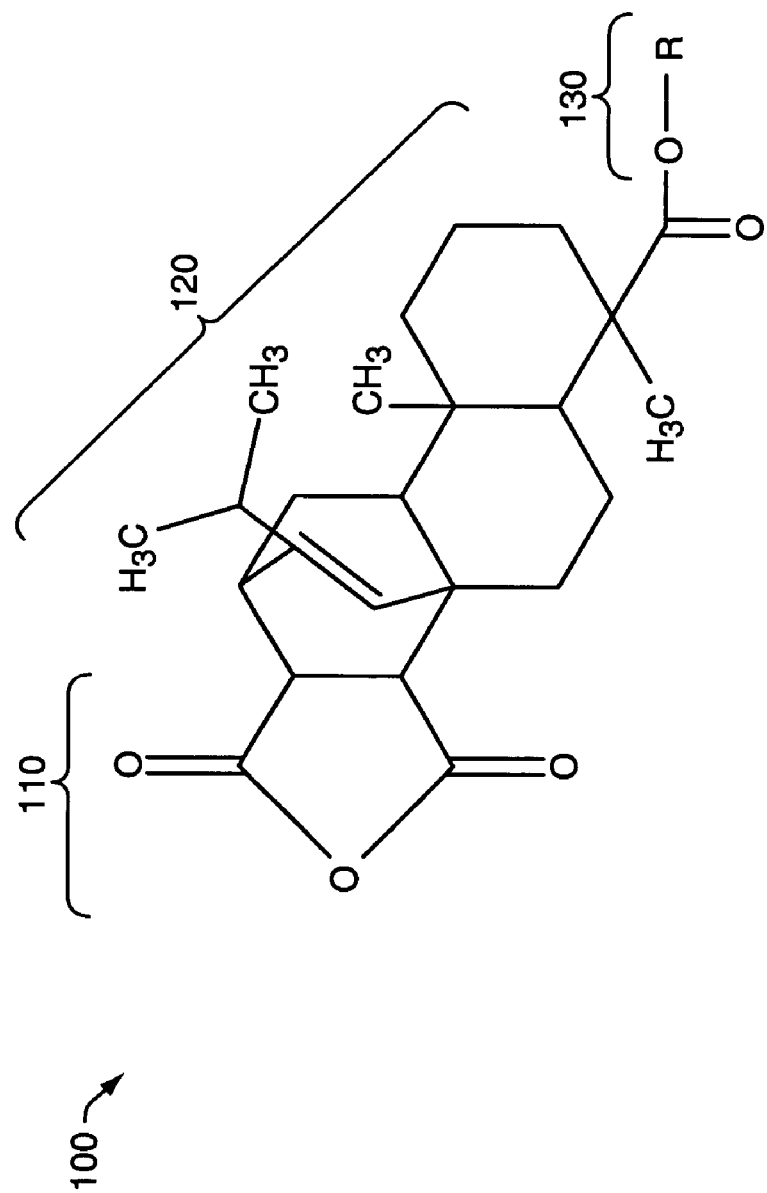
FIG. 1 shows an anhydride adduct of a rosin compound containing a single organic rosin acid moiety that may be used as a fluxing agent in an underfill material, according to one embodiment of the invention.

In the following description, numerous specific details are set forth. However, it is understood that embodiments of the invention may be practiced without these specific details. In other instances, well-known circuits, structures and techniques have not been shown in detail in order not to obscure the understanding of this description.

I. Overview

Traditionally, the solder joints in flip chip devices have experienced reliability problems due to thermo-mechanical stresses. There are often differences in the coefficients of thermal expansion between the microelectronic device, which often includes a silicon die, and the substrate, which often includes an FR-4 glass epoxy or similar printed circuit board. The differences in the coefficients of thermal expansion may lead to stresses and strains on the solder joints used to connect the microelectronic device to the substrate during routine temperature cycling excursions experienced in the device. In certain cases, the stresses and strains may cause the solder joints to fail.

Underfill materials are generally introduced in the gap between the microelectronic device and the substrate to help reduce the thermo-mechanical stresses and improve device reliability. The underfill materials, which often include filled epoxies, provide mechanical strength and are often stiff enough to absorb much of the stress and strain due to the coefficient of thermal expansion mismatch. The underfill material generally also protects the active surface of the microelectronic device from moisture and impurities. The use of such underfill materials, when properly selected and applied, may significantly reduce the stresses and strains on the solder joints. It is not uncommon for the underfill material to help improve device reliability by an order of magnitude, or more.

A no flow underfill process is a commonly employed process for introducing the underfill material between the substrate and the microelectronic device. In a representative no flow underfill process, an underfill material may be applied to the substrate before the microelectronic device is assembled relative to the substrate.

No flow underfill materials often include a fluxing agent to remove metal oxides from solder bumps during the solder reflow. Traditionally, low molecular weight (MW) carboxylic acids, such as adipic acid (MW=146) or citric acid (MW=192), or low molecular weight anhydrides, such as methyl hexahydro phthalic anhydride (MHHPA) (MW=160) or nadic methyl anhydride (NMA) (MW=178), have been employed as fluxing agents. Generally, low molecular weight carboxylic acids and anhydrides have an appreciable vapor pressure at the elevated temperatures employed during solder reflow or underfill curing. These temperatures are often in a range between about 200° C. to 250° C. When heated to these temperatures, the fluxing agents may vaporize, and may potentially cause voids to form in the underfill material as it cures. Carboxylic acids may additionally potentially cause voiding as a result of decarboxylation or dehydration. The voids may concentrate thermomechanical stresses, trap undesired moisture, or otherwise reduce the effectiveness of the underfill material and degrade device reliability. Another potential problem, if a carboxylic acid fluxing agent is employed, is premature reaction with the underfill material. Such reaction may potentially alter the curing kinetics, prematurely increase the viscosity, and hinder solder joint formation.

II. Exemplary Anhydride Adducts Of Rosin Compounds

Figure 2:
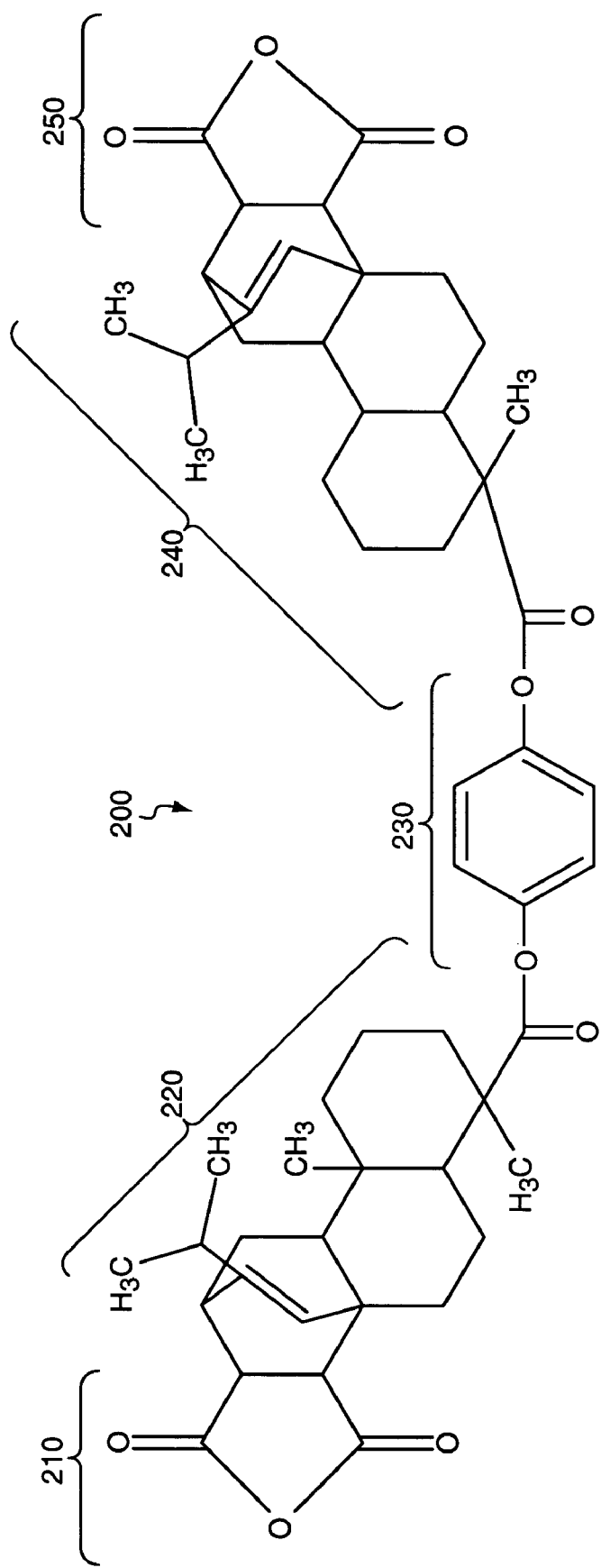
FIG. 2 shows an anhydride adduct of a rosin compound containing a plurality of linked organic rosin acid moieties that may be used as a fluxing agent in an underfill material, according to one embodiment of the invention.

FIGS. 1–2 show exemplary anhydride adducts of rosin compounds. An embodiment of the invention may include a method of introducing such a compound into an underfill material. Another embodiment of the invention may include a composition containing an underfill material and such a compound. Yet another embodiment of the invention may include a method of applying a composition containing an underfill material and such a compound over a surface of a substrate and using the compound as a fluxing agent. A still further embodiment of the invention may include a microelectronic package containing an underfill material and a moiety of such a compound bonded with the underfill material.

A. Compounds Containing Single Organic Rosin Acid Moieties

FIG. 1 shows an anhydride adduct of a rosin compound 100 containing a single organic rosin acid moiety that may be used as a fluxing agent in an underfill material, according to one embodiment of the invention. The anhydride adduct of the rosin compound includes a maleic anhydride moiety 110, a single organic rosin acid moiety 120, and an ester moiety 130. Before discussing the structure of the compound in greater detail, a brief discussion of rosins, and organic rosin acids, may be beneficial.

Rosin has been used as a soldering flux for many years and is believed to possess good fluxing characteristics. Rosin generally refers to a naturally occurring organic material derived from trees or other plant sources. Exemplary rosins include, but are not limited to, wood rosin, gum rosin, tall oil rosin, oleoresin, other plant rosins. Such rosins generally include a mixture of organic acids and a variety of other compounds, such as fatty acids and triterpenes. The composition of the rosin, and the relative proportions of the different organic acids, generally depends on the source of the rosin, such as the wood from which it is derived, and upon other factors, such as the temperatures and chemical treatments used to process the rosin.

Organic acids commonly found in rosins include diterpene resin acids. Two types of diterpene resin acids commonly found in rosins are abietic type acids (for example levopimaric acid, abietic acid, neoabietic acid, palustric acid, and dehydroabietic acid) and pimaric type acids (for example pimaric, isopimaric, and sandaracopimaric). Some diterpene resin acids, such as abietic acid, are cyclic isoprenoid acids.

Referring again to FIG. 1, the illustrated organic rosin acid moiety is based on an abietic type acid, such as levopimaric acid, although this is not required. Abietic type acids generally include three fused six-membered rings, which are based on four isoprene units. Other organic rosin acid moieties that may optionally be employed include, but are not limited to, those derived from other organic rosin acids, resin acids, diterpene resin acids, cyclic isoprenoid acids, fused polycyclic isoprenoid monocarboxylic acids, abietic type acids, pimaric type acids, pimaric acid, isomers of pimaric acid, isopimaric acid, sandaracopimaric acid, and combinations of such acids. Either isolated acids or combinations of acids may be employed. The terms organic rosin acid, resin acid, diterpene resin acid, cyclic isoprenoid acid, fused polycyclic isoprenoid monocarboxylic acid, abietic type acid (or pimaric type acid), abietic acid or isomers thereof (or pimaric acid or isomers thereof) are all related, and generally appear in order from more general at the beginning of the list to more specific at the end. As used herein, the term rosin compound does not impose any limitation that the compound be derived from a rosin, and includes synthetic compounds that are also found in rosins, as well as derivatives of compounds that are found in rosins, synthetic or otherwise.

Referring again to FIG. 1, the maleic anhydride moiety is bonded to the organic rosin acid moiety at a Diels-Alder addition site, where the organic rosin acid moiety had an unsaturated double bond. Levopimaric acid includes a conjugated diene containing two double bonds that are separated by one single bond. A dienophile anhydride, such as maleic anhydride, containing a double bond having one or two carbon, nitrogen, or oxygen atoms, may be reacted or adducted with the conjugated diene of an organic rosin acid, to give a Diels-Alder adduct or anhydride adduct. It will be appreciated that other dienophile anhydrides, whether cyclic or non-cyclic, may optionally be employed, and that the addition site may potentially have other positions if other organic rosin acids are employed.

The ester moiety 130 includes an acyl group (R'CO—) of the organic rosin acid moiety bonded to an —OR group, where the R' includes the organic rosin acid moiety, and the R may include, but is not limited to, an alkyl group, such as a methyl, ethyl, propyl, butyl, or other group having, for example, between 1 to 10 or 1 to 20 carbons, or an aryl group, such as a phenyl group (—$C_6H_5$). The ester moiety represents an esterification reaction product that may be formed by an esterification reaction of the carboxylic acid group of the organic rosin acid and an alcohol, phenol, or other compound providing the —OR group. The —OR group is a substitute group or moiety in place of an acidic hydroxyl (—OH) group of a carboxylic acid group that was natively present in the organic rosin acid corresponding to the organic rosin acid moiety. The use of an ester or other replacement moiety for the acidic hydroxyl group of the carboxylic acid is not required, but may assist in eliminating the carboxylic acid group, which may react with the underfill material and alter the curing kinetics thereof, and which may potentially decarboxylate or otherwise cause voiding. Accordingly, another potential advantage of the anhydride adduct of the rosin compound is reduced voiding and less alteration of the underfill material compared to native organic rosin acids. Alternatively, in another embodiment of the invention, the ester moiety may be omitted, and the acidic hydroxyl group of the organic rosin acids carboxylic acid group retained.

The fluxing agent shown in FIG. 1 combines the good fluxing characteristics traditionally associated with rosins and the epoxy hardening characteristics traditionally associated with anhydrides. Also, the ester moiety replaces the hydroxyl of the carboxylic acid group, which may prematurely react with underfill material, and potentially hinder solder joint formation.

Moreover, the fluxing agent contains an organic rosin acid moiety having a molecular weight of approximately 300, which is substantially higher than the molecular weights of the low molecular weight carboxylic acids and anhydrides commonly employed as fluxing agents. When combined with the maleic anhydride moiety, which has a molecular weight of about 100, the fluxing agent achieves a molecular weight that is at least about 400, plus any additional molecular weight provided by the ester moiety. It is typically the case that the vapor pressure of organic compounds decreases with increasing molecular weight. At this molecular weight, the vapor pressure of the fluxing agent at reflow or curing temperatures, which are typically in a range between about 200° C. to 250° C., are expected to be quite small. Accordingly, the use of such high molecular weight fluxing agents may help to reduce voiding traditionally caused by fluxing agent vaporization.

B. Compounds Containing A Plurality Of Linked Organic Rosin Acid Moieties

FIG. 2 shows an anhydride adduct of a rosin compound 200 containing a plurality of linked organic rosin acid moieties that may be used as a fluxing agent in an underfill material, according to one embodiment of the invention. The anhydride adduct of the rosin compound includes a first maleic anhydride moiety 210, a first organic rosin acid moiety 220, a linking ester moiety 230, a second organic rosin acid moiety 240, and a second maleic anhydride moiety 250. The compound includes an ester of a first organic rosin acid moiety linked to an ester of a second organic rosin acid moiety. The linking ester moiety links the first and the second organic rosin acid moieties and approximately doubles the molecular weight of the fluxing agent compared to the fluxing agent shown in FIG. 1.

The first maleic anhydride moiety 210 is bonded to the first organic rosin acid moiety 220 at a first Diels-Alder addition site, where the first organic rosin acid had an unsaturated double bond. Likewise, the second maleic anhydride moiety 250 is bonded to the second organic rosin acid moiety 240 at a second Diels-Alder addition site, where the second organic rosin acid had an unsaturated double bond. In the illustrated fluxing agent, both organic rosin acid moieties are based on levopimaric acid, although this is not required. In another embodiment, other potentially different organic rosin acid moieties may be employed. Other potentially different dienophile anhydrides may also optionally be used, and the addition sites may potentially be different if other organic rosin acids are employed.

The linking ester moiety 230 is bonded or esterified to the first rosin acid moiety and replaces the acidic hydroxyl group (—OH) of the carboxylic acid that was natively present in the organic rosin acid from which the first organic rosin acid moiety was derived. Likewise, the ester moiety is bonded or esterified to the second rosin acid moiety and replaces the acidic hydroxyl group of the carboxylic acid that was natively present in the organic rosin acid from which the second organic rosin acid moiety was derived. As discussed above, substituting the hydroxyl groups may help to avoid a reaction with the underfill material, which could potentially increase the viscosity of the underfill material, and hinder solder joint formation. This may also potential help to avoid a decarboxylation reaction, which could produce gas, and cause voids.

The ester moiety joins or otherwise links, and dimerizes, the first and the second organic rosin acid moieties. The ester moiety, in the illustrated embodiment, includes an aryl group, similar to a phenyl group (—$C_6H_5$), but in which two hydrogens, in para positions relative to one another, have been removed. The corresponding ring carbons where the hydrogen atoms have been removed have been attached through the ester linkages to the first and the second organic rosin acid moieties, respectively. One function of the ester moiety is to link a plurality of organic rosin acid moieties and thereby significantly increase, or multiply, the molecular weight of the fluxing agent.

The plurality of linked organic rosin acid moieties give the fluxing agent shown in FIG. 2 a molecular weight which is almost twice that of the fluxing agent shown in FIG. 1. The molecular weight of the fluxing agent is greater than 800 (actual MW is about 870). The vapor pressure of such a fluxing agent is expected to be less than approximately 5 mmHg (millimeters of mercury), at a temperature of about 250° C. Such a low vapor pressure is generally considered to be negligible and the amount of voiding due to fluxing agent vaporization is also expected to be negligible. This reduction of voiding may help improve device reliability and help extend operational life.

The particular illustrated ester moiety is not required, and other ester moieties may also optionally be employed. As one example, instead of a hydroquinone (aka 1,4-benzenediol) moiety, a catechol (aka 1,2-benzenediol) or a resorcinol (aka 1,3-benzenediol moiety may optionally be employed. As another example, other diols or compounds containing two hydroxyl groups, such as butanediol or other alkanediols, or ethylene glycol, may optionally be employed. Triols or other polyols may potentially be employed and may potentially link three or more organic rosin acid moieties via three or more ester linkages. Exemplary polyols include but are not limited to glycerol, trimethylol ethane, trimethylol propane, trimethylol butane, pentaerythritol, sorbitol, or a combination thereof. Also non-ester replacement moieties for the hydroxyl group of the carboxylic acid may also potentially be employed. For example, thiols and other replacement groups may potentially be used, if desired.

III. Introducing Anhydride Adduct of Rosin Into Underfill Material

Figure 3:
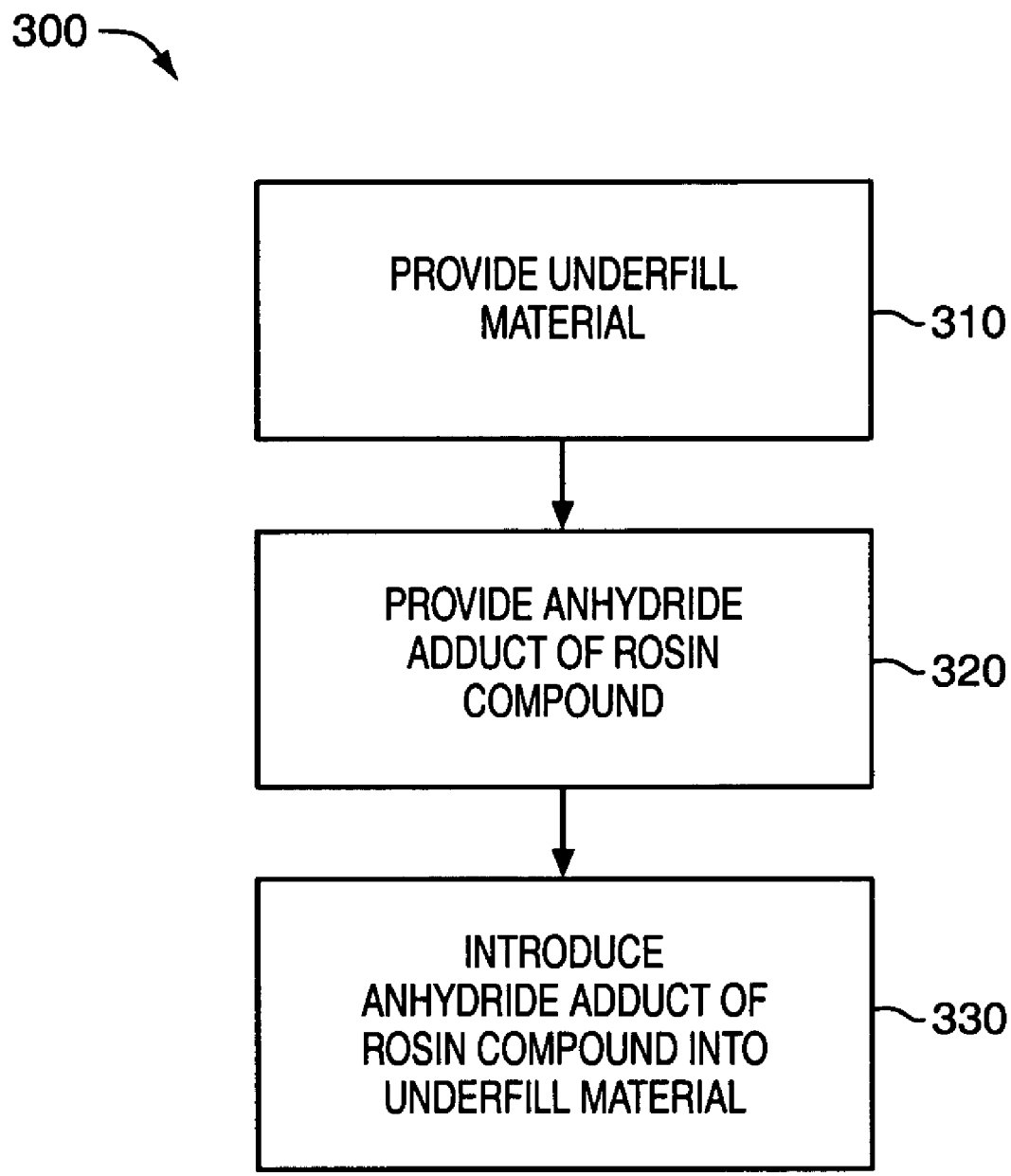
FIG. 3 shows a method for introducing an anhydride adduct of a rosin compound into an underfill material, according to one embodiment of the invention

FIG. 3 shows a method 300 for introducing an anhydride adduct of a rosin compound into an underfill material, such as a no flow underfill material, according to one embodiment of the invention. The method includes providing an underfill material, at block 310, and providing an anhydride adduct of a rosin compound, at block 320. The materials may be provided in any desired order.

Suitable underfill materials include but are not limited to epoxy materials, cyanate ester materials, acrylic materials, and other underfill materials, and no flow underfill materials known in the arts. Three commonly employed epoxy underfill materials that are suitable are epoxy-anhydride underfill materials, epoxy-amine underfill materials, and epoxy-phenol underfill materials. These underfill materials are commercially available from numerous sources. An exemplary no flow underfill material includes Hysol FF2200, commercially available from Loctite, of Rocky Hill, Conn. The underfill material may include a variety of optional components, such as fillers (for example silica fillers) to modify a coefficient of thermal expansion or other property of the underfill material, adhesion promoters, hardeners, or other optional chemical additives.

Referring again to FIG. 3, the anhydride adduct of the rosin compound may be introduced into the underfill material, at block 330. The underfill material may be added to a bowl, container, stirred tank, inline pipe mixer, or other material combination device. If desired, a material combination device with cooling capability may be employed to cool the materials. The materials may be cooled to a temperature that is less than room temperature and greater than a freezing point of the underfill material. Such cooling, although not required, may be appropriate to help suppress curing reactions.

Then, the anhydride adduct of the rosin compound may be introduced or added into the underfill material contained in the fluid combination device. The anhydride adduct of the rosin compound may be added in an amount that is appropriate for such a fluxing agent. For example, the weight ratio of fluxing agent to underfill material (for a fluxing agent with a weight similar to those shown in FIG. 1 or 2) may be in a range between about 1:1000 to 1:10, or about 1:500 to 1:15, or about 1:50 to 1:25.

If desired, an alcohol, such as an alkanol or glycol, may be introduced into the underfill material. The alcohol may be added in an amount that is sufficient to help to transform an anhydride group into a carboxylic acid group (for example open the anhydride ring of a maleated rosin) during the elevated temperatures leading up to reflow or cure. By way of example, the weight of glycol or a similar alcohol to underfill material may be in a range between about 1:1000 to 1:20, or about 1:100 to 1:50. It is noted that inclusion of such an alcohol is not required and the small amount of moisture typically present in the underfill material may be used to perform such transformation of the anhydride, although with perhaps less regularity and control.

If desired, fillers, or other optional conventional components, if they are not already included in the provided underfill material, may be introduced into the underfill material. The components may be introduced either before, after, or during the introduction of the anhydride adduct of the rosin compound.

If desired, the underfill material may then be mixed to help distribute the anhydride adduct of the rosin compound. After any mixing, the underfill material may optionally be degassed under a vacuum to remove air bubbles trapped in the material during mixing. A low vacuum is often sufficient. After any degassing, the underfill material may be used, or stored until needed. The underfill material is often cooled during storage to help suppress curing reactions and increase the storage life. The desired cooling temperature generally depends on the underfill material, although a temperature around −40° C. may be appropriate for an epoxy resin.

In this embodiment of the invention, the anhydride adduct of the rosin compound has been introduced into a liquid underfill material, although the invention is not so limited. In an alternate embodiment of the invention, an anhydride adduct of a rosin compound may be included in a solid encapsulant material, such as an Anisotropic Conductive Adhesive (ACA), a resin sheet underfill, wafer-level solid film underfill, a powder that may be melted to form a film, or a paste containing a solid and a liquid. In a representative example, an anhydride adduct of a rosin compound may be introduced into the solid or film before it is solidified, may be introduced around particles of a powder, or may be included in a liquid of a paste. Also, the use of a crosslinking underfill material is not required, and non-thermosetting underfill materials, such as thermoplastic underfill materials, may also optionally be employed. Such non-thermosetting underfill materials may facilitate reworkability.

IV. Fabricating Flip Chip Microelectronic Package Using Underfill Material Containing Anhydride Adduct Of Rosin Compound FIG. 4a–4d show cross-sectional views representing different stages of a method for fabricating a flip chip microelectronic package 450 using a no flow underfill material containing an anhydride adduct of a rosin compound, according to one embodiment of the invention.

Figure 4A:
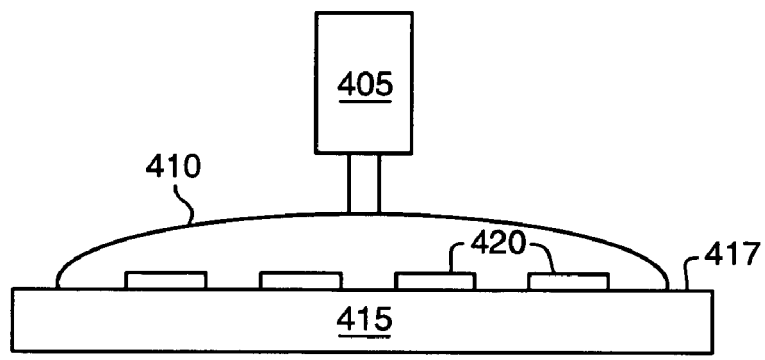
FIG. 4a shows a cross-sectional view of an applicator applying a no flow underfill material containing an anhydride adduct of a rosin compound over a substrate, according to one embodiment of the invention.

FIG. 4a shows a cross-sectional view of an applicator 405 applying a no flow underfill material 410 containing an anhydride adduct of a rosin compound over a substrate 415, according to one embodiment of the invention. The underfill material may be prepared as described in FIG. 3, or otherwise. The substrate, which may include a printed circuit board, has a contact surface 417 having a plurality of pads 420 attached thereto. The pads may include a metal or other conductive material to carry an electrical signal. As used herein the term metal includes alloys and other metal-containing mixtures. The applicator, which may include a conventional no flow underfill dispenser, applies the no flow underfill material over the surface of the substrate and over the contact pads. The underfill material may be applied over at least a flip chip bonding location of the substrate where a microelectronic device, such as a die, is to be attached. A sufficient quantity of the underfill material should be applied so that voids do not occur as a result of incomplete filling, but applying too much of the underfill material should be avoided, as this may lead to die floating and increased risk of forming an incomplete solder joint.

Although the name would seem to indicate otherwise, the no flow materials are generally liquids, and often do in fact flow during application and assembly. As used herein, the term no flow underfill material is used for its understood meaning in the art, and not to imply that the underfill materials do not flow. Other terms that may be used relatively interchangeably with no flow underfill material include pre-applied underfill materials, dispense first underfill materials, and apply before assemble underfill materials.

Figure 4B:
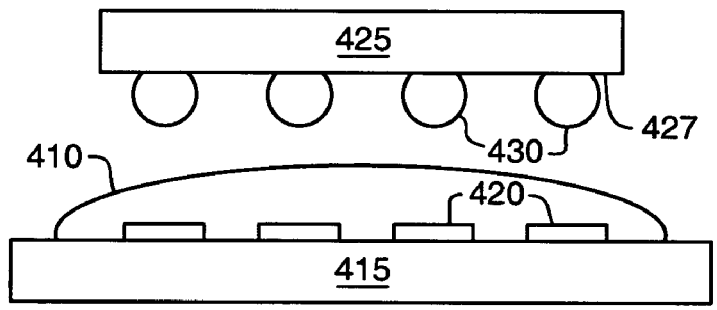
FIG. 4b shows a cross-sectional view of a microelectronic device placed over the substrate and underfill material of FIG. 4a, according to one embodiment of the invention.

FIG. 4b shows a cross-sectional view of a microelectronic device 425 placed in position relative to, and in this case over, the substrate 415 and underfill material 410 of FIG. 4a, according to one embodiment of the invention. The applicator is removed after any application or dispensing of the underfill material. Then, the microelectronic device, which may include a semiconductor die, is brought over the substrate. The particular logic included in the microelectronic device is not a limitation of the invention. Examples of microelectronic devices include, but are not limited to, processors (for example microprocessors), ASICs (Application Specific Integrated Circuits), and high end DSPs (Digital Signal Processors). The microelectronic device has an active surface 427 with a plurality of solder bumps 430 attached thereto. The solder bumps often include a metal, such as an alloy. Suitable metals for the solder bump include but are not limited to tin-lead solders, and such lead-free solders as tin-silver solders, tin-copper solders, tin-silver-copper solders, and tin-bismuth solders. The microelectronic device is brought into close proximity to the substrate, with the active surface of the microelectronic device facing the contact surface of the substrate, and with the plurality of solder bumps aligned over the plurality of pads.

Figure 4C:
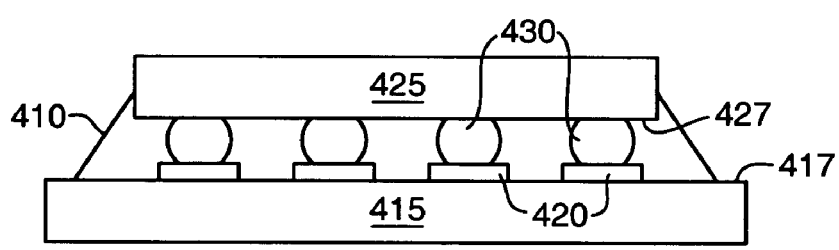
FIG. 4c shows a cross-sectional view of a microelectronic device-substrate assembly formed by placing the solder bumps of the microelectronic device into contact with the pads of the substrate, according to one embodiment of the invention.

FIG. 4c shows a cross-sectional view of a microelectronic device-substrate assembly formed by placing the solder bumps 430 of the microelectronic device 425 into contact with the pads 420 of the substrate 415, according to one embodiment of the invention. After placing the microelectronic device over the substrate, as shown in FIG. 4b, the microelectronic device and the substrate may be brought together. The solder bumps may contact the underfill material, and may exude the underfill material disposed between them and the pads, as they are brought closer to the pads. If desired, a small compression force may be applied to help bring the solder bumps into contact with the pads. Die pick and place equipment is often employed to assemble the microelectronic device relative to the substrate. The underfill material is disposed around the pads and the solder bumps, between the substrate and the microelectronic device. In the illustrated embodiment of the invention, the underfill material wets the right-hand and left-hand edges of the microelectronic device, although this is not required. Other degrees of wetting, including no edge wetting, may also optionally be employed.

The assembly shown in FIG. 4c may be heated to reflow the solder bumps and cure the underfill material. The solder bumps and the underfill material may be heated from a starting temperature near ambient to a melting point temperature of a material of the solder bumps. Prior to reflow, the anhydride groups of the anhydride adduct of the rosin compound may hydrolyze with water, or react with an alcohol in the underfill material, to form carboxylic acid groups. The carboxylic acid groups are generally considered to be good fluxing agents and may assist with cleaning the solder to help improve the integrity of the solder joint, by removing metal oxides from the solder bumps and other metals of the interconnect structure, prior to and during the reflowing of the solder bumps. Depending upon the particular carboxylic acid groups, the metal oxides, and other factors, such cleaning may begin to occur at a temperature in a range between about 150° C. to 200° C.

The temperature of the underfill material and solder bumps may be further increased to the melting point temperature of the solder. The melting point temperature for eutectic tin-lead solders may be between about 180° C. to 185° C., whereas the melting point temperature for a tin-silver solder may be between about 220° C. to 225° C. Generally as the melting point temperature of the solder is achieved, the solder bumps may begin to melt and reflow. During reflow, the solder bumps may be formed into improved contact with the pads of the substrate. The pads and the reflowed solder bumps may form an interconnect structure that couples the microelectronic device with the substrate. The interconnect structure may carry electrical signals and serve as a signaling path or signaling medium for the package. It should be noted that the illustrated interconnect structure is not required, and other interconnect structures known in the arts may also optionally be employed.

The carboxylic acid forms of the anhydride adducts of the rosin compounds may continue to remove metal oxides from the solder bumps, pads, and other portions of the interconnect structure, during the melting and reflow. Such removal of the metal oxides may improve solder joint integrity and reliability. The compounds may also coat the interconnect structures to help suppress oxidation during the higher temperatures typically employed during curing.

Generally, it may be appropriate for the no flow underfill material not to cure significantly prior to the solder reflow. Up to and during the solder reflow, the anhydride adduct of the rosin compound generally does not react appreciably with the underfill material. A potential advantage is that the anhydride adduct of the rosin is not consumed and may serve its intended purpose as a fluxing agent. Another potential advantage is that the viscosity does not appreciably increase due to premature curing. In this way, the solder joints may form without hinder from a viscous solution that could potentially prevent a solder joint from forming.

The underfill material may be cured after the melting and the reflow of the solder bumps. Generally, the temperature of the underfill material is increased above the melting point temperature of the solder material to promote more rapid curing. For example, the temperature may be increased between about 10° C. to 40° C., or about 20° C. to 30° C. higher than the melting point temperature of the solder material, depending upon the particular solder and underfill materials. The anhydride adduct of the rosin compound may react with the underfill material. For example, the anhydride group of the compound may react with an epoxy underfill material as typical in an anhydride-epoxy resin system.

Figure 4D:
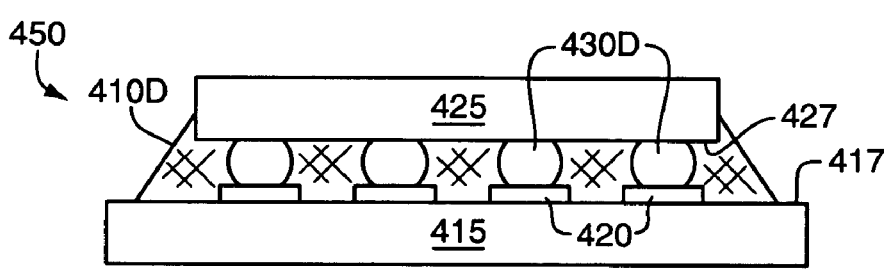
FIG. 4d shows a cross-sectional view of a flip chip microelectronic package after reflowing the solder bumps and curing the underfill material, according to one embodiment of the invention.

FIG. 4d shows a cross-sectional view of a flip chip microelectronic package 450 after reflowing the solder bumps and curing the underfill material, according to one embodiment of the invention. The microelectronic package includes the microelectronic device 425, the substrate 415, the pads 420, reflowed solder bumps 430D, and a cured underfill material 410D between the microelectronic device and the substrate, around the pads and the reflowed solder bumps. The cured underfill material physically connects the microelectronic device to the substrate and may provide stiffness to help protect the interconnect structure, the microelectronic device, and the substrate from damage due to thermo-mechanical stresses. The cured underfill material may also protect the surfaces of the interconnect structure, the microelectronic device, and the substrate from moisture and other causes of corrosion.

Due in part to the use of a high molecular weight adduct of a rosin compound as a fluxing agent, instead of a low molecular weight carboxylic acid or anhydride, the cured underfill material may have less voids to concentrate stresses, trap moisture, or otherwise degrade device reliability. As a result, the manufacturing yields and the operational life of the microelectronic package may be improved.

Figure 5:
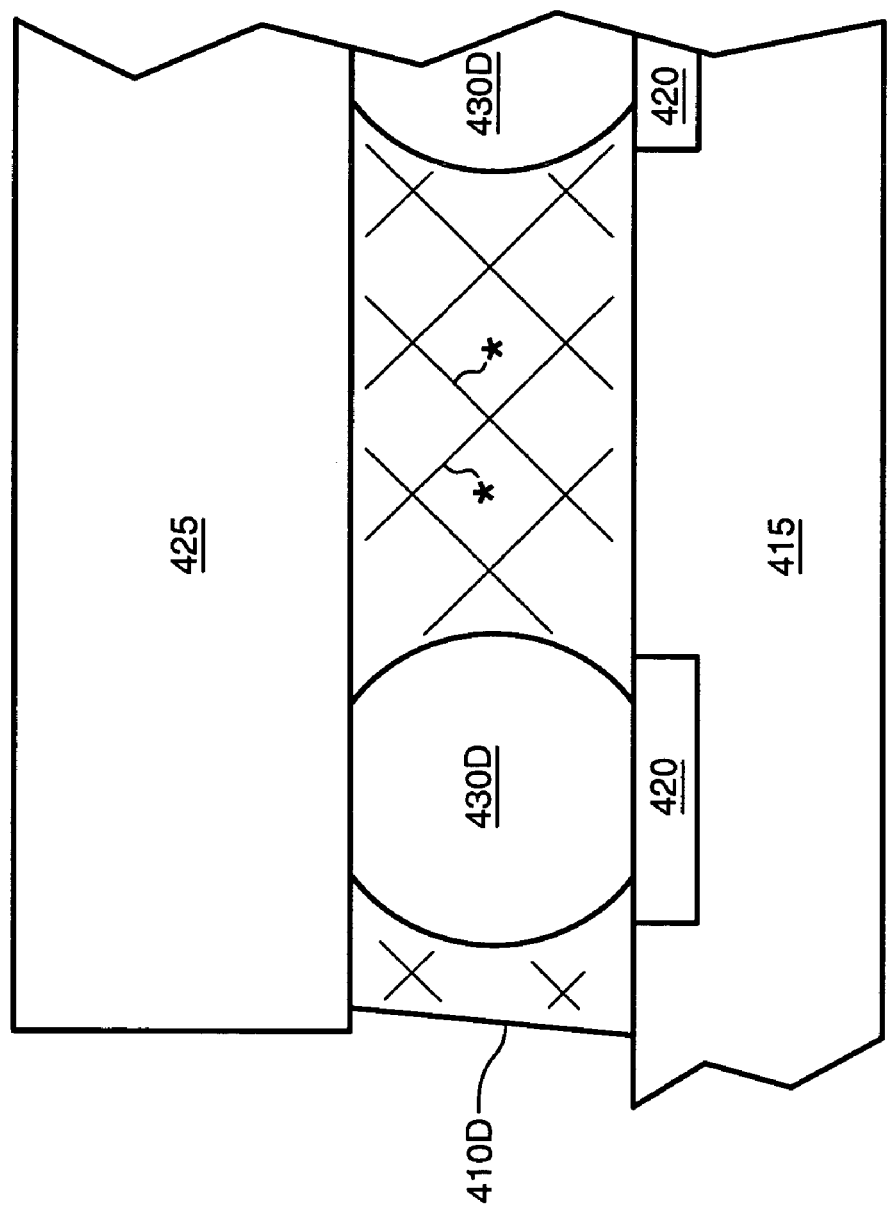
FIG. 5 shows a cross sectional view of a portion of a microelectronic package containing a cured underfill material having a plurality of organic rosin acid moieties (as indicated by asterisks) bonded thereto, according to one embodiment of the invention.

FIG. 5 shows a cross sectional view of a portion of a microelectronic package containing a cured underfill material having a plurality of organic rosin acid moieties (as indicated by asterisks) bonded thereto, according to one embodiment of the invention. The organic rosin acid moieties may be derived from anhydride adduct of rosin compound fluxing agents. In one aspect, the organic rosin acid moiety may include an esterified organic rosin acid moiety having a substitute moiety in place of an acidic hydroxyl group of a carboxylic acid group. In another aspect, the organic rosin acid moiety may be linked with a second organic rosin acid moiety. In yet another aspect, a linking moiety may be esterified to the organic rosin acid moiety and a second organic rosin acid moiety may be esterified to the linking moiety. Such rosin moieties in cured underfill materials may potentially be detected by infrared spectroscopy, or other analysis methods.

V. Exemplary Computer Architecture Employing Microelectronic Package

Figure 6:
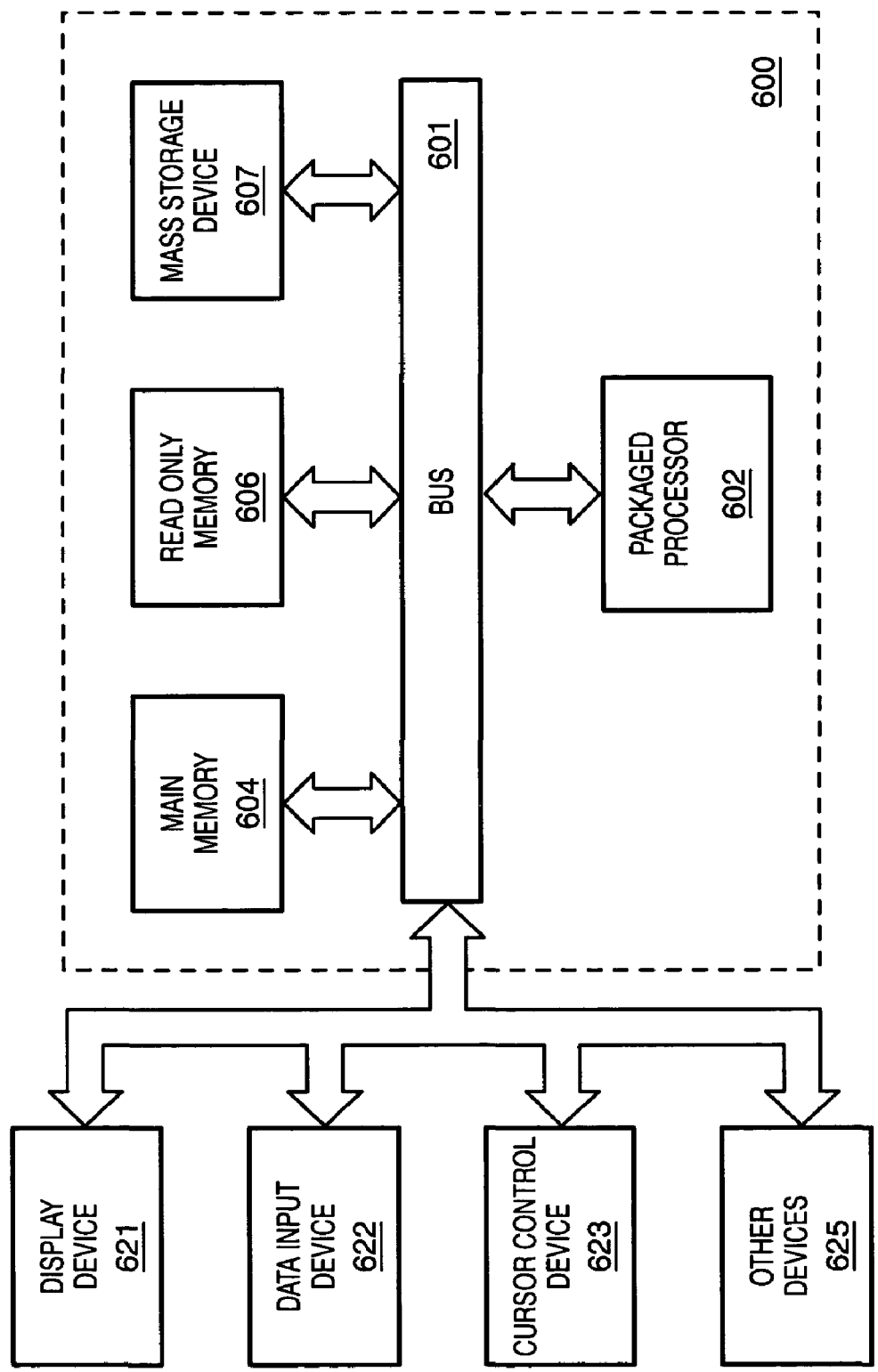
FIG. 6 shows an exemplary computer system in which an embodiment of the invention may be implemented.

Microelectronic packages such as those described herein may be used in various electrical systems known in the arts. A computer system 600 representing an exemplary laptop, desktop, workstation, host, or server in which features of the present invention may be implemented will now be described with reference to FIG. 6.

The computer system contains a bus 601 to communicate information, and a processor 602 coupled with the bus 601 to process information. In one embodiment of the invention, the processor may be packaged using a no flow underfill material having an anhydride adduct of a rosin compound as a fluxing agent, as discussed elsewhere herein. The computer system 600 further comprises a random access memory (RAM) or other dynamic storage device 604 (referred to as main memory), coupled with the bus 601 to store information and instructions to be executed by the processor 602. The main memory 604 also may be used to store temporary variables or other intermediate information during execution of instructions by the processor 602. Different types of memories that are employed in some, but not all, computer systems include DRAM memories, SRAM memories, and Flash memories. The computer system 600 also comprises a read only memory (ROM) and other static storage devices 606 coupled with the bus 601 to store static information and instructions for the processor 602, such as the BIOS. A mass storage device 607 such as a magnetic disk, zip, or optical disc and its corresponding drive may also be coupled with the computer system 600 to store information and instructions.

The computer system 600 may also be coupled via the bus 601 to a display device 621, such as a cathode ray tube (CRT) or liquid crystal display (LCD), to display information to an end user. Typically, a data input device 622, such as a keyboard or other alphanumeric input device including alphanumeric and other keys, may be coupled with the bus 601 to communicate information and command selections to the processor 602. Another type of user input device is a cursor control device 623, such as a mouse, a trackball, or cursor direction keys, to communicate direction information and command selections to the processor 602 and to control cursor movement on the display 621. Other devices 625 may be coupled with the bus 610 in some but not all computer systems. Exemplary devices include but are not limited to a network interface, a communication interface, an audio device, and a video input device.

VI. Preparing Anhydride Adducts Of Rosin Compounds

Various preparations of maleated rosin esters are discussed in the patent literature. U.S. Pat. No. 4,643,848 to Thomas et al., discusses making modified rosin polyhydric alcohol esters by reacting a rosin with an unsaturated dibasic acid, such as maleic anhydride, using pentaerythritol (in Example 1 and 3–6) or sorbitol (Example 2). U.S. Pat. No. 6,583,263 to Gaudl (hereinafter referred to as the '263 patent) discusses the preparation of a maleated rosin ester in Example 1. Related approaches may be employed to prepare anhydride adducts of rosin compounds, such as the compounds shown in FIGS. 1 and 2.

For example, based on Example 1 of the '263 patent, about a mole of rosin or an organic rosin acid, such as levopimaric acid or abietic acid, may be stirred under nitrogen for about 90 minutes at a temperature of about 180C. Then, about a mole of maleic anhydride may be added. The temperature may be maintained at about 180C for about 15 minutes, then the temperature may be raised to about 215C and the combination may be stirred at that temperature for about 1 hour.

Then, in order to make a compound having a single organic rosin acid moiety, about a mole of an alcohol having a single hydroxyl group, such as methanol, ethanol, propanol, or another alkanol having, for example, between 1 to 10 or 1 to 20 carbons, or an aryl group, such as a phenyl group (—C$_6$H$_5$) may be added to the organic rosin acid. Alternatively, in order to make a compound having two linked organic rosin acid moieties, about a half mole of a diol, such as butanediol, hydroquinone, or ethylene glycol, may be added to the organic rosin acid.

If desired, magnesium oxide, or other esterification catalysts known in the arts, such as phosphininc acid, may optionally be included, although this is not required. If a catalyst is not desired, a longer time for reaction may be employed. After adding the alcohol, and any desired catalyst, the temperature may be raised to about 260C to 270C and the reaction mixture may be stirred until the acid value decreases to about 30 mg KOH/g, or less. It is understood that the above example is to be construed as merely illustrative and that other preparation methods known in the arts may also optionally be employed.

VII. General Matters

While the invention has been described in terms of several embodiments, those skilled in the art will recognize that the invention is not limited to the embodiments described, but can be practiced with modification and alteration within the spirit and scope of the appended claims. Some of the methods are described in their most basic form, but operations can be added to or deleted from any of the methods. In other instances, well-known circuits, structures, devices, and techniques have been shown in block diagram form or without detail in order not to obscure the understanding of this description. The description is thus to be regarded as illustrative instead of limiting.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features are sometimes grouped together in a single embodiment, Figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

In the claims, any element that does not explicitly state "means for" performing a specified function, or "step for" performing a specified function, is not to be interpreted as a "means" or "step" clause as specified in 35 U.S.C. Section 112, Paragraph 6.

What is claimed is:

1. A composition comprising an underfill material and an anhydride adduct of a rosin compound.

2. The composition of claim 1, wherein the anhydride adduct of the rosin compound comprises an ester of an organic rosin acid moiety.

3. The composition of claim 1:
   wherein the anhydride adduct of the rosin compound comprises a substitute moiety in place of an acidic hydroxyl group of a carboxylic acid group of an organic rosin acid corresponding to the organic rosin acid moiety; and
   wherein the substitute moiety is attached at an acyl group to the organic rosin acid moiety.

4. The composition of claim 1, wherein the anhydride adduct of the rosin compound comprises a plurality of linked organic rosin acid moieties.

5. The composition of claim 1, wherein the anhydride adduct of the rosin compound comprises an ester of a first organic rosin acid moiety linked to an ester of a second organic rosin acid moiety.

6. The composition of claim 1:
   wherein the underfill material comprises a no flow underfill material; and
   wherein the anhydride adduct of the rosin compound comprises a first organic rosin acid moiety esterified to a linking moiety and a second organic rosin acid moiety esterified to the linking moiety.

7. The composition of claim 1, wherein the underfill material comprises a no flow underfill material.

8. A method comprising introducing an anhydride adduct of a rosin compound into an underfill material.

9. The method of claim 8, wherein said introducing comprises introducing an anhydride adduct of a rosin compound including an ester of an organic rosin acid moiety into a no flow underfill material.

10. The method of claim 8, wherein said introducing comprises introducing an anhydride adduct of a rosin compound containing a plurality of linked organic rosin acid moieties into a no flow underfill material.

11. The method of claim 8, wherein said introducing comprises introducing an anhydride adduct of a rosin compound containing a first organic rosin acid moiety esterified to a linking moiety and a second organic rosin acid moiety esterified to the linking moiety into a no flow underfill material.

12. A method comprising applying a no flow underfill material containing an anhydride adduct of a rosin compound over a surface of a substrate.

13. The method of claim 12, wherein said applying comprises applying a no flow underfill material containing an anhydride adduct of a rosin compound including an ester of an organic rosin acid moiety over the surface of the substrate.

* * * * *